(12) United States Patent
Huang et al.

(10) Patent No.: US 11,054,740 B2
(45) Date of Patent: Jul. 6, 2021

(54) IMPRINT MOLD AND METHOD FOR MANUFACTURING THE SAME

(71) Applicant: AU OPTRONICS CORPORATION, Hsin-Chu (TW)

(72) Inventors: Sheng-Ming Huang, Hsin-Chu (TW); Sheng-Kai Lin, Hsin-Chu (TW); Chih-Chiang Chen, Hsin-Chu (TW); Hui-Ku Chang, Hsin-Chu (TW); Chia-Hsin Chung, Hsin-Chu (TW); Wei-Chi Wang, Hsin-Chu (TW); Ming-Jui Wang, Hsin-Chu (TW); Jen-Kuei Lu, Hsin-Chu (TW); Tsai-Sheng Lo, Hsin-Chu (TW); Huang-Kai Shen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 214 days.

(21) Appl. No.: 16/126,396

(22) Filed: Sep. 10, 2018

(65) Prior Publication Data
US 2019/0079394 A1 Mar. 14, 2019

(30) Foreign Application Priority Data

Sep. 12, 2017 (TW) .................................. 106131277

(51) Int. Cl.
*G03F 7/00* (2006.01)
(52) U.S. Cl.
CPC .................. *G03F 7/0002* (2013.01)
(58) Field of Classification Search
CPC .............................. G03F 7/0002; G03F 7/0017
See application file for complete search history.

(56) References Cited

U.S. PATENT DOCUMENTS 8,703,406 B2 * 4/2014 Schaper ................ G03F 7/0002
430/323
9,082,625 B2 7/2015 Clevenger et al.
(Continued)

FOREIGN PATENT DOCUMENTS

CN 102514377 A 6/2012
CN 104714364 A 6/2015

OTHER PUBLICATIONS

CNIPA has issued the Office Action for the corresponding China application dated Oct. 10, 2020.

*Primary Examiner* — Nahida Sultana
(74) *Attorney, Agent, or Firm* — WPAT, PC

(57) ABSTRACT

An imprint mold and a method for manufacturing the same are provided. The imprint mold includes a plurality of substantially identical or different mold patterns, wherein there isn't any height difference between the mold patterns. The imprint mold manufacturing method includes: disposing a first layer on a substrate; disposing a first hard mask layer on the first layer, wherein the first hard mask layer includes one or more first hollow area; forming a first mold pattern on the first layer by imprinting, wherein the region of the first mold pattern completely overlaps the region of the vertical projection of the first hollow area on the first layer; removing the first hard mask layer; disposing a second hard mask layer on the first layer, wherein the second hard mask layer includes one or more second hollow area, wherein the region of the vertical projection of the second hollow area on the first layer is adjacent to the first mold pattern; forming a second mold pattern on the first layer by imprinting, wherein the region of the second mold pattern completely overlaps the region of the vertical projection of the second hollow area on the first layer; and removing the second hard mask layer.

11 Claims, 10 Drawing Sheets

(56) References Cited

U.S. PATENT DOCUMENTS

| | | |
|---|---|---|
| 9,553,021 B2* | 1/2017 | Menath ............... H01L 21/3086 |
| 2010/0108639 A1 | 5/2010 | Kasono |
| 2010/0140220 A1 | 6/2010 | Cho et al. |
| 2011/0042352 A1 | 2/2011 | Okushima et al. |
| 2012/0214308 A1* | 8/2012 | Inada .................... G03F 7/0002 |
| | | 438/694 |
| 2013/0120698 A1 | 5/2013 | Takakuwa et al. |
| 2014/0065834 A1 | 3/2014 | Kishimoto |
| 2014/0113020 A1 | 4/2014 | Kureishi et al. |
| 2014/0151733 A1* | 6/2014 | Koike .................. H01L 33/005 |
| | | 257/98 |
| 2014/0335215 A1 | 11/2014 | Hayashi et al. |
| 2017/0336547 A1* | 11/2017 | Park ..................... G03F 7/0002 |
| 2018/0081265 A1* | 3/2018 | Singh .................... G03F 7/0002 |

* cited by examiner

IMPRINT MOLD AND METHOD FOR MANUFACTURING THE SAME

BACKGROUND OF THE INVENTION

1. Field of the Invention

The present invention generally relates to an imprint mold and a method for manufacturing the same.

2. Description of the Prior Art

In manufacturing a mold having nano-structure patterns for nanoimprint lithography (NIL) technique, an electron beam lithography technique is often used with organic photoresist to form nano-structure patterns on flat mold. However, the equipment for forming nano-structure patterns by NIL technique is expensive, wherein the process is time consuming and can only be used in wafers smaller than 12". Therefore, it is not suitable for manufacturing large-area mold having nano-structure patterns.

Another process for manufacturing a large-area mold having nano-structure patterns is splicing a plurality of small molds to form a large-area mold by a splicing process. One of the approaches is forming a plurality of duplicate small molds from a small mother mold using photo polymerization or others and arranging the plurality of duplicate small molds to produce a large-area mold. However, overlapping and height differences usually occur when the small molds are arranged closely, hence invalid nanoimprint areas are formed in subsequent processes. It affects the quality of nanoimprint and even leads to subsequent problems of nano-structure etching.

A second approach is producing a large-area mold by a Step-and-Repeat method. However, an ideal splicing interface with complete continuity is not easily formed with the structure at the splicing location. Achieving the required splicing accuracy is an issue to be resolved.

Therefore, there is still room for improvement with respect to reducing the cost for manufacturing large-area mold having nano-structure patterns.

SUMMARY OF THE INVENTION

An object of the present invention is to provide an imprint mold and a method for manufacturing the same, wherein the manufacturing cost can be reduced.

The imprint mold of the present invention includes a plurality of substantially identical or different mold patterns, wherein there isn't any height difference between the mold patterns.

A surface of the imprint mold of the present invention includes a first area, a second area, and an overlapping area. A first mold pattern is disposed in the first area, wherein the first mold pattern includes a first line width and a first depth. A second mold pattern is disposed in the second area, wherein the second mold pattern includes a second line width and a second depth. The overlapping area is located between the first area and the second area, wherein a third mold pattern is disposed in the overlapping area. The third mold pattern includes a third line width and a third depth. The top faces of the first mold pattern, the second mold pattern, and the third mold pattern are on the same level. The third line width ≤ the first line width or the second line width. The third depth ≤ the first depth or the second depth.

A surface of the imprint mold of the present invention includes a first area, a second area, and an overlapping area. A first mold pattern is disposed in the first area, wherein the first mold pattern includes a first line width and a first depth. A second mold pattern is disposed in the second area, wherein the second mold pattern includes a second line width and a second depth. The overlapping area is located between the first area and the second area, wherein the overlapping area is concave and has a third depth. The top faces of the first mold pattern and the second mold pattern are on the same level, wherein the third depth the first depth or the second depth.

A surface of the imprint mold of the present invention includes a first area and a second area. A first mold pattern is disposed in the first area, wherein the first mold pattern includes a first line width and a first depth. The second mold pattern is disposed in the second area, wherein the second mold pattern includes a second line width and a second depth. There is spacing between the first area and the second area. The top faces of the first mold pattern and the second mold pattern are on the same level, wherein the spacing is not equal to the first line width and the second line width.

The imprint mold manufacturing method of the present invention includes: (Step S1000) disposing a first layer on a substrate; (Step S2000) disposing a first hard mask layer on the first layer, wherein the first hard mask layer includes one or more first hollow area via photolithography; (Step S3000) forming a first mold pattern on the first layer, wherein the region of the first mold pattern completely overlaps the region of the vertical projection of the first hollow area on the first layer; (Step S4000) removing the first hard mask layer; (Step S5000) disposing a second hard mask layer on the first layer, wherein the second hard mask layer includes one or more second hollow area via photolithography, wherein the region of the vertical projection of the second hollow area on the first layer is adjacent to the first mold pattern; (Step S6000) forming a second mold pattern on the first layer, wherein the region of the second mold pattern completely overlaps the region of the vertical projection of the second hollow area on the first layer; and (Step S7000) removing the second hard mask layer.

DETAILED DESCRIPTION OF THE PREFERRED EMBODIMENT

Figure 1A:
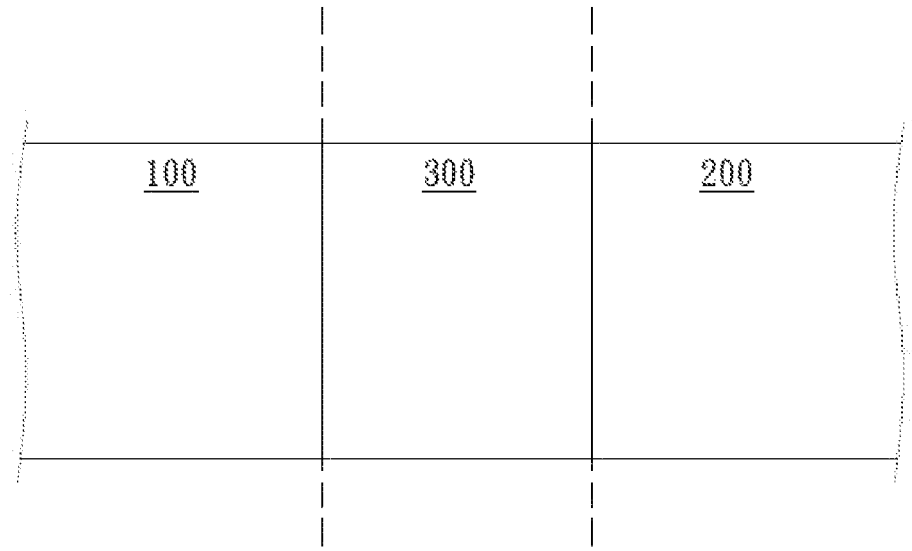
FIGS. 1A to 5B illustrate the embodiments of the imprint mold of the present invention.

In the drawings, the thickness of layers, films, panels, regions, etc., are exaggerated for clarity. The same reference numerals denote the same elements throughout the specification. It will be understood that when an element such as a layer, film, region, or substrate is referred to as being "on" or "connected to" another element, it can be directly on or in connection with another element, or Intermediate elements can also exist. In contrast, when an element is referred to as being "directly on another element" or "directly connected to" another element, there are no intervening elements present. As used herein, "connected" may refer to a physical and/or electrical connection.

As used herein, "about," "approximately," or "substantially" includes the average of the stated values and acceptable deviations of the particular value determined by one of ordinary skill in the art, taking into account the discussed measurement and the specific amount of measurement-related error (i.e., the limits of the measuring system). For example, "about" can mean within one or more standard deviations of the stated value, or within ±30%, ±20%, ±10%, ±5%.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted as having a meaning that is consistent with their meaning in the context of the related art and the present invention and will not be interpreted as idealized or excessive. The formal meaning, unless explicitly defined in this article.

As shown in the embodiments in FIGS. 1A to 5B, the imprint mold of the present invention includes a plurality of substantially identical or different mold patterns, wherein there isn't any height difference between the mold patterns. More particularly, a surface of the imprint mold of the present invention includes a plurality of areas having mold patterns, wherein there isn't any height difference between the mold patterns. In other words, the top face of the mold patterns are substantially even.

Figure 1B:
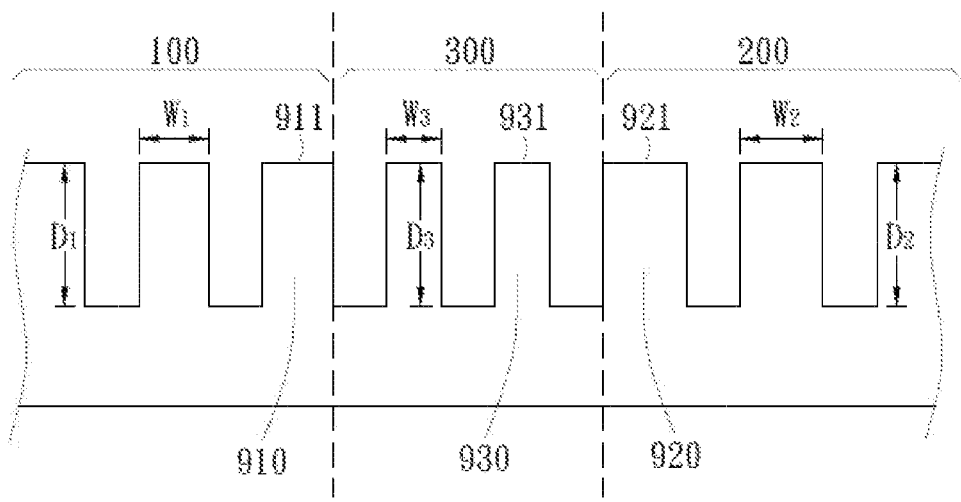

As shown in the top view and side view of an embodiment in FIGS. 1A and 1B, a surface of the imprint mold 900 includes a first area 100, a second area 200, and an overlapping area 300. A first mold pattern 910 is disposed in the first area 100, wherein the first mold pattern 910 includes a first line width $W_1$ and a first depth $D_1$. The second mold pattern 920 is disposed in the second area 200, wherein the second mold pattern 920 includes a second line width $W_2$ and a second depth $D_2$. The overlapping area 300 is located between the first area 100 and the second area 200, wherein a third mold pattern 930 is disposed in the overlapping area 300. The third mold pattern 930 includes a third line width $W_3$ and a third depth $D_3$. The top face 911 of the first mold pattern 910, the top face 921 of the second mold pattern 920, and the top face 931 of the third mold pattern 930 are on the same level. Specifically, said "line width" and "depth" refer respectively to the sectional width and height of the pattern structures.

As shown in the embodiment in FIG. 1B, the third line width $W_3$ the first line width $W_1$ and the second line width $W_2$, wherein the first line width $W_1$ and the second line width $W_2$ can be substantially the same or different. In different embodiments, however, the third line width W3 could be smaller or equal to merely one of the first line width $W_1$ and the second line width $W_2$.

As shown in the embodiment in FIG. 1B, the third depth $D_3$ the first depth $D_1$ and the second depth $D_2$, wherein the first depth $D_1$ and the second depth $D_2$ can be substantially the same or different. In different embodiments, however, the third depth $D_3$ could be smaller or equal to merely one of the first depth $D_1$ and the second depth $D_2$.

Figure 2A:
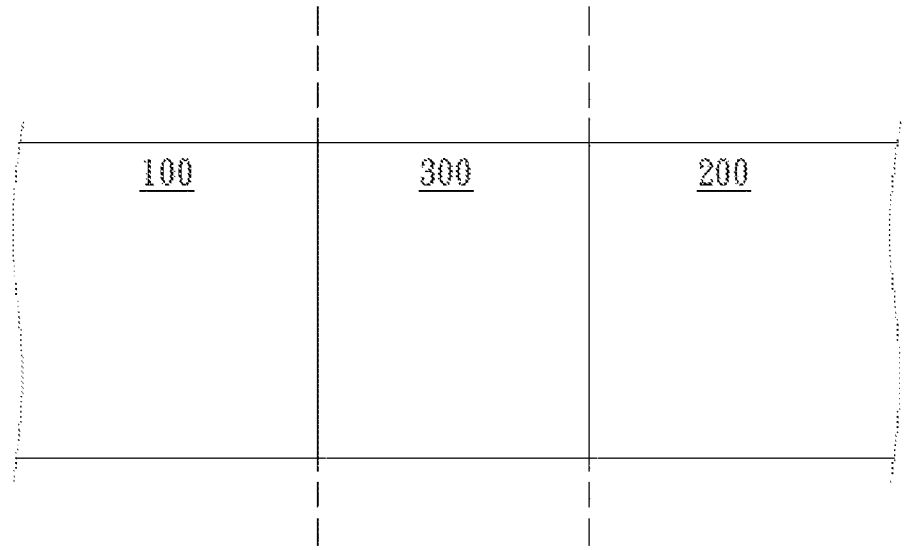
Figure 2B:
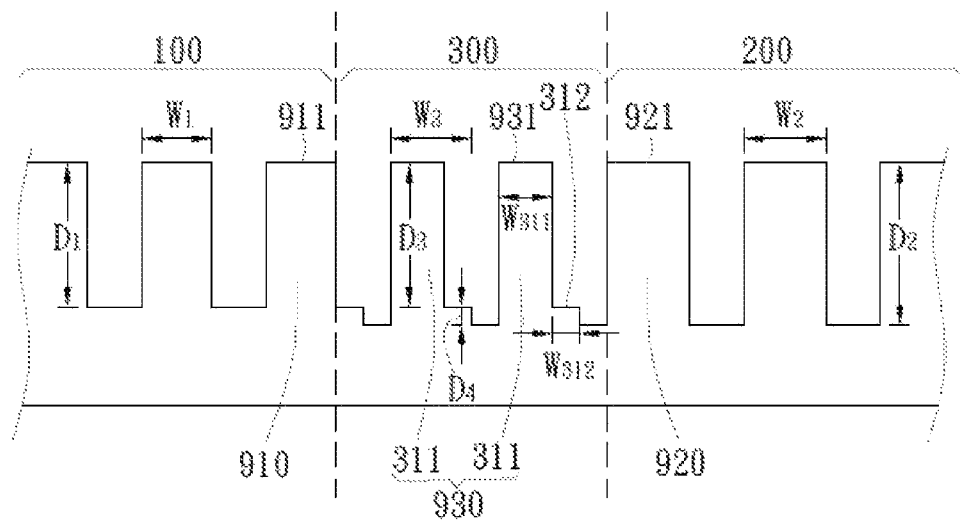

As shown in the top view and side view of another embodiment in FIGS. 2A and 2B, the third mold pattern 930 includes a plurality of third pattern units 311, wherein the root of each of the plurality of third pattern units 311 includes a protrusion 312. The protrusion 312 of each of the plurality of third pattern units 311 has a protrusion line width $W_{312}$, wherein the rest part of each of the plurality of third pattern units 311 other than the protrusion 312 has the third pattern unit line width $W_{311}$. Specifically, the protrusion 312 can be deemed a stair-like structure connected with the root of the third pattern units 311. The depth of the third pattern unit 311 is equal to the third depth $D_3$. The height $D_4$ of the protrusion 312 is equal to the difference between the first depth $D_1$ and the second depth $D_2$. The third line width $W_3$ is equal to the sum of the protrusion line width $W_{312}$ and the third pattern unit line width $W_{311}$. Except for the description regarding the protrusion 312 and the third pattern unit 311, the description regarding the first mold pattern 910 disposed in the first area 100 (e.g. the first line width $W_1$ and the first depth $D_1$), the description regarding the second mold pattern 920 disposed in the second area 200 (e.g. the second line width $W_2$ and the second depth $D_2$), and the description regarding the third mold pattern 930 disposed in the overlapping area 300 (e.g. the third line width $W_3$ and the third depth $D_3$) could be referred to in the description set above.

As shown in the embodiments in FIGS. 2A and 2B, there isn't any height difference between the first mold pattern 910 and the second mold pattern 920. Also, there isn't any height difference between the third mold pattern 930 and the first mold pattern 910 and the second mold pattern 920 respectively. In other words, the top face 911 of the first mold pattern, the top face 921 of the second mold pattern, and the top face 931 of the third pattern 930 are even. Accordingly, the optical difference of the overlapping area could be reduced. As shown in the top view and side view of a different embodiment in FIGS. 3A and 3B, however, the top face 931 of the third pattern 930 can be lower than both the top face 911 of the first mold pattern and the top face 921 of the second mold pattern.

As shown in the embodiments in FIGS. 1A to 3B, the third mold pattern 930 is disposed in the overlapping area 300. The top face 911 of the first mold pattern 910 and the top face 921 of the second mold pattern 920 are about on the same level. The third depth $D_3 \leq$ the first depth $D_1$ or the second depth $D_2$. In different embodiments, however, there could be no pattern disposed in the overlapping area 300. For example, as shown in the top view and side view of another embodiment in FIGS. 4A and 4B, the overlapping area concaves and has a third depth $D_3$. The top face 911 of the first mold pattern 910 and the top face 921 of the second mold pattern 920 are about the same level. The third depth is $D_3$ substantially equal to the first depth $D_1$ or the second depth $D_2$. Moreover, as shown in the embodiments in FIGS. 3B and 4B, the description regarding the first mold pattern 910 disposed in the first area 100 (e.g. the first line width $W_1$ and the first depth $D_1$), the description regarding the second mold pattern 920 disposed in the second area 200 (e.g. the second line width $W_2$ and the second depth $D_2$), and the description regarding the third line width $W_3$ or etc. can be referred to in the description set above.

In the imprint mold of the present invention, it is optional for the first depth $D_1$ to be equal to the second depth $D_2$, and also optional for the first line width $W_1$ to be equal to the second line width $W_2$. Specifically, in the embodiments shown in FIGS. 1B, 2B, and 3B, the first depth $D_1$ and the second depth $D_2$ are not equal. In the embodiment shown in FIG. 4B, the first depth $D_1$ and the second depth $D_2$ are about equal. In the embodiments shown in FIGS. 1B, 2B, 3B, and 4B, the first line width $W_1$ and the second line width $W_2$ are not equal.

Figure 5A:
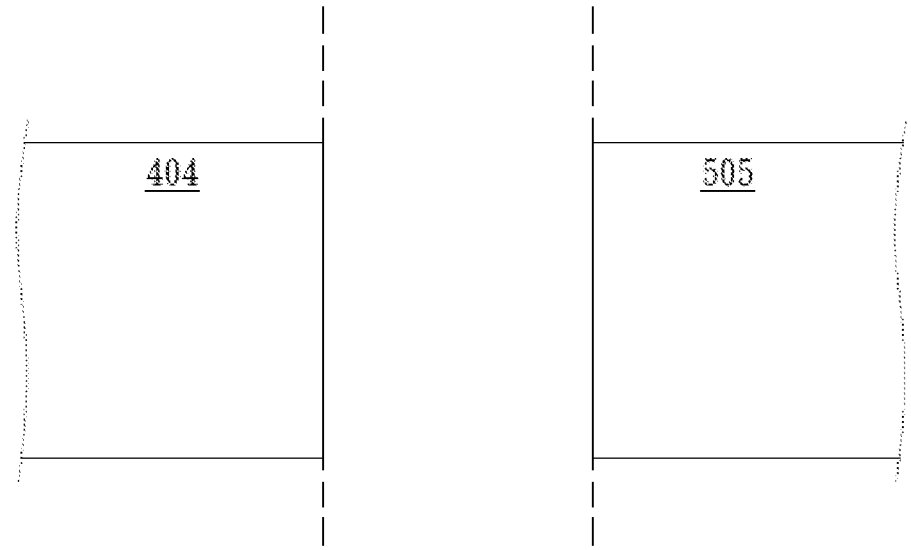
Figure 5B:
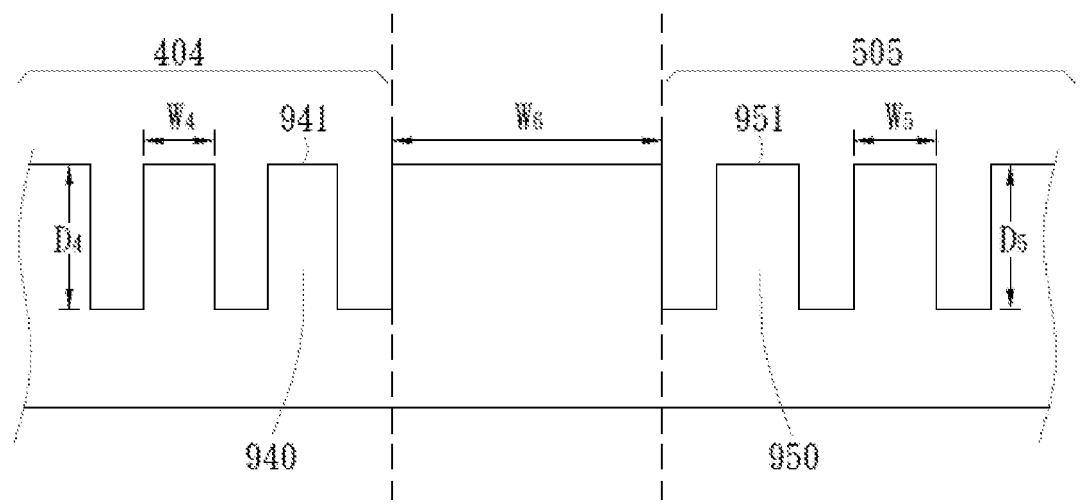

As shown in the top view and side view of another embodiment in FIGS. 5A and 5B, the surface of the imprint mold 900 includes a first area 404 and a second area 505. A first mold pattern 940 is disposed in the first area 404, wherein the first mold pattern 940 includes a first line width $W_4$ and a first depth $D_4$. A second mold pattern 950 is disposed in the second area 505, wherein the second mold pattern 950 includes a second line width $W_5$ and a second depth $D_5$. There is a spacing $W_6$ between the first area 404 and the second area 505. The top face 941 of the first mold pattern 940 and the top face 951 of the second mold pattern 950 are about the same level. The spacing $W_6$ is equal to neither the first line width $W_4$ nor the second line width $W_5$.

It is optional for the first depth $D_4$ to be equal to the second depth $D_5$. It is optional for the first line width $W_4$ to be equal to the second line width $W_5$. Specifically, as shown in the embodiment in FIG. 5B, the first depth $D_4$ and the second depth $D_5$ are not equal, wherein the first line width $W_4$ and the second line width $W_5$ are about equal. Said "line width" and "depth" refer respectively to the sectional width and height of the pattern structures.

Figure 3A:
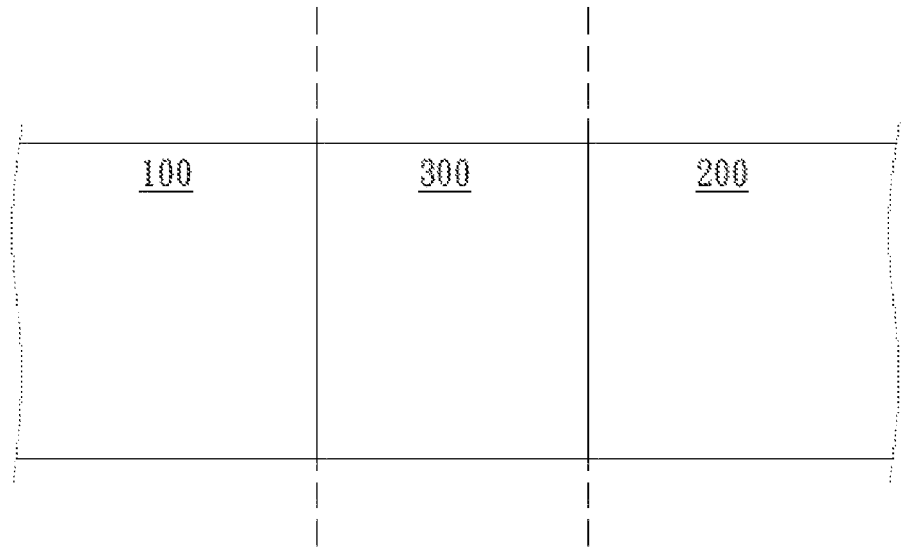
Figure 3B:
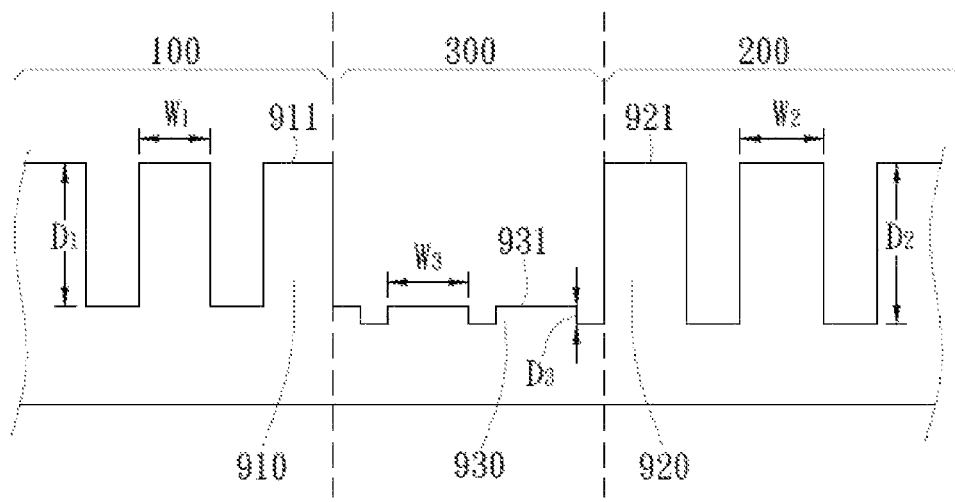
Figure 4A:
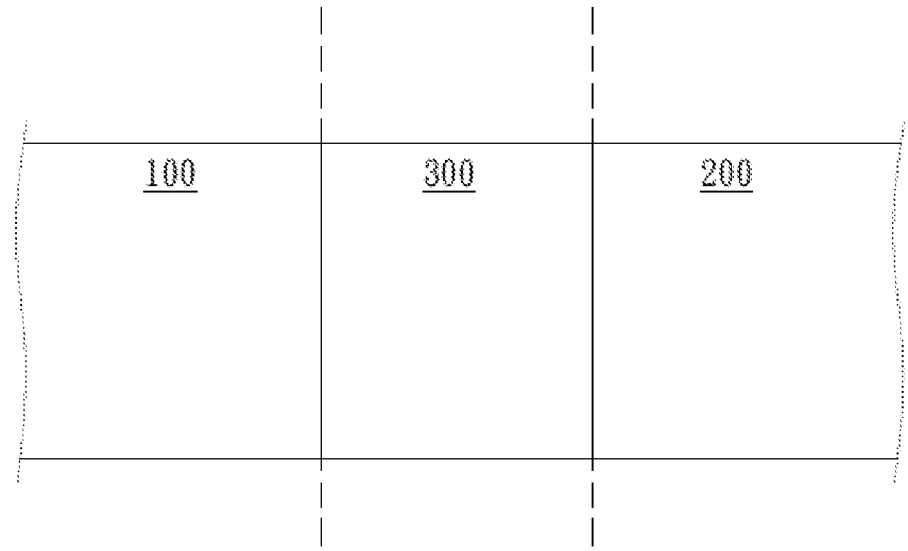
Figure 4B:
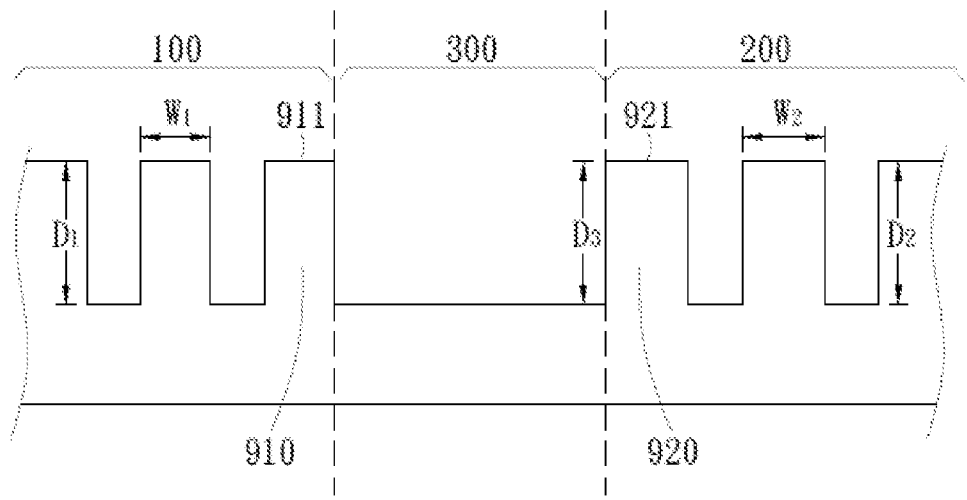

Furthermore, considering the overlapping area 300 and the optical matching requirement, the imprint mold 900 of the present invention could be either a concave type or a convex type as shown in the different embodiments in FIGS. 3B, 4B, and 5B.

Figure 6:
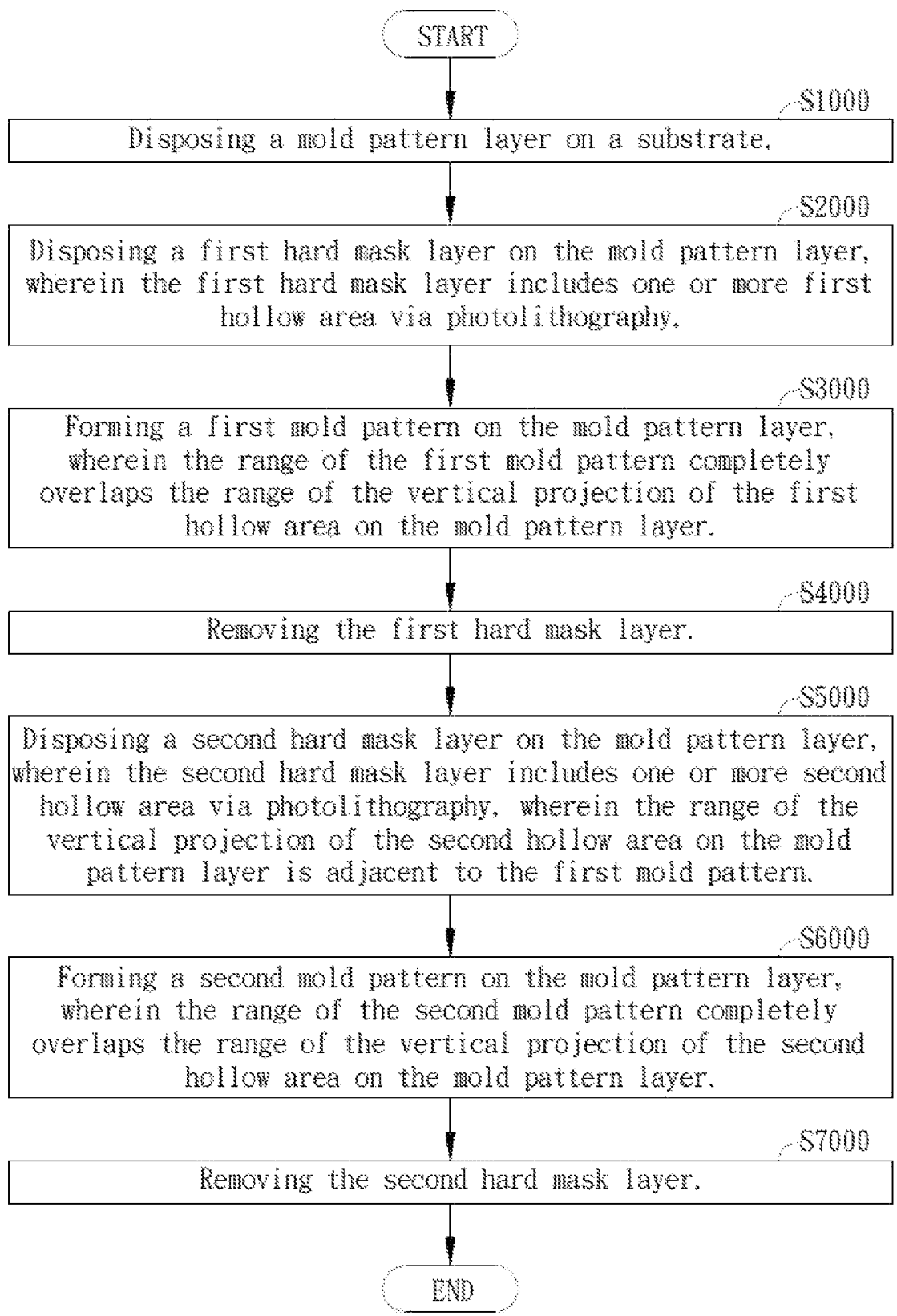
FIG. 6 illustrates a flow chart of an embodiment of the imprint mold manufacturing method of the present invention.

As shown in the flow chart in FIG. 6, the imprint mold manufacturing method of the present invention includes the following steps.

Figure 7A:
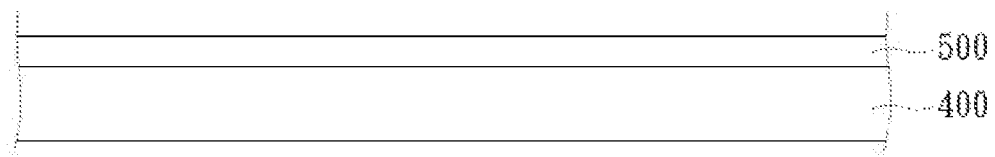
FIGS. 7A to 7K illustrate an embodiment of manufacturing an imprint mold by the imprint mold manufacturing method of the present invention.

Step S1000 is a step that disposes a first layer on a substrate. For example, as shown in one embodiment in FIG. 7A, a first layer 500 is disposed on a substrate 400. The substrate 400 includes glasses, polymers, metals, or metallic oxides. The first layer 500 could be single layer or multiple layers, wherein the material of the first layer 500 includes silicon dioxide or other suitable materials. The depositing could be performed by physical vapor deposition (PVD), such as sputtering, and/or by chemical vapor deposition (CVD).

Figure 7B:
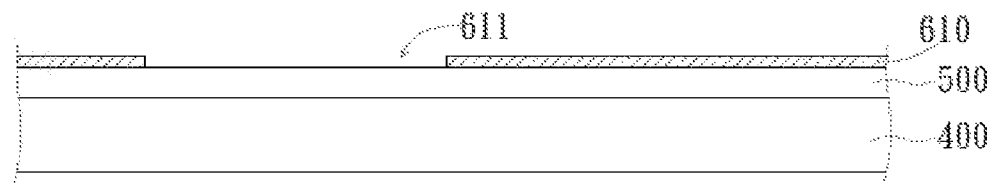

Step S2000 is a step that disposes a first hard mask layer on the first layer, wherein the first hard mask layer includes one or more first hollow area. For example, as shown in one embodiment in FIG. 7B, a first hard mask layer 610 is disposed on the first layer 500, wherein the first hard mask layer 610 includes one or more first hollow area 611. The first hard mask layer 610 could be single layer or multiple layers, which could be metal mask or alloy mask. The first hard mask layer 610 could be dispositied by electroplating, electroless-plating, physical vapor deposition, and/or chemical vapor deposition.

Figure 7C:
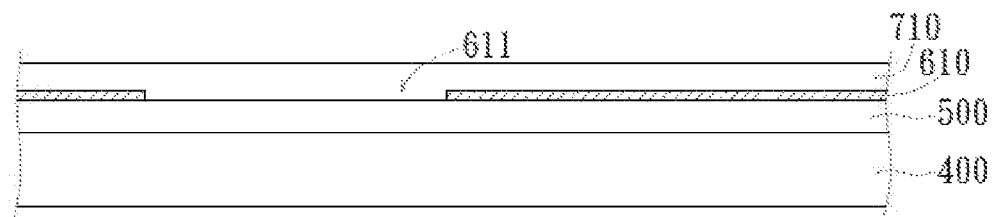

Step S3000 is a step that forms a first mold pattern on the first layer, wherein the region of the first mold pattern completely overlaps the region of the vertical projection of the first hollow area on the first layer. For example, in one embodiment, step S3000 includes disposing a first imprint photo-resist layer 710 on the first hard mask layer 610 and the first hollow area 611 as shown in FIG. 7C. Then, applying an imprinting on a first imprint area 701 of the first imprint photo-resist layer 710 to form a first imprint pattern 711, wherein the region of the vertical projection of the first imprint area 701 on the first hard mask layer 610 contains the region of the first hollow area 611 completely. Afterward, an etching to the first imprint photo-resist layer 710 and the first layer 500 is performed to form the first mold pattern 910 on the first layer 500 as shown in FIG. 7E. To be certain of the area of the first mold pattern 910 after etching, preferably, the region of the formed first imprint pattern 711 includes a portion of the first imprint photo-resist layer 710 on the first hard mask layer 610 adjacent to the first hollow area 611.

In one embodiment, nano-imprint lithography is used in the step of applying an imprinting on the first imprint area 701 of the first imprint photo-resist layer 710 to form the first imprint pattern 711. The detailed steps of performing an etching to the first imprint photo-resist layer 710 and the first layer 500 to form the first mold pattern 910 on the first layer 500 could be seen in FIGS. 8A to 8C. More particularly, the first imprint photo-resist layer 710 having the first imprint pattern 711 is used as a mask while performing the etching. Since the first imprint pattern 711 is formed by nano-imprint lithography, the first mold pattern 910 as an end result of etching is in nano-scale.

Figure 7D:
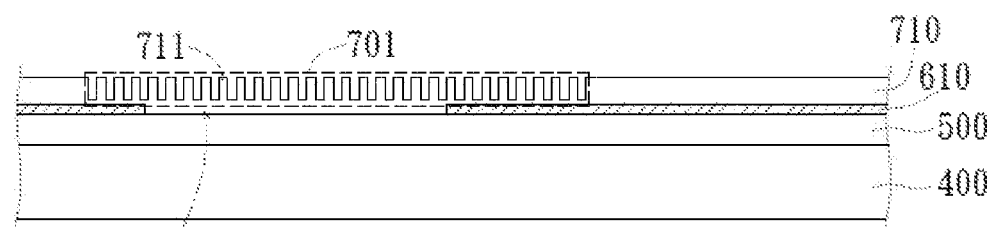
Figure 7E:
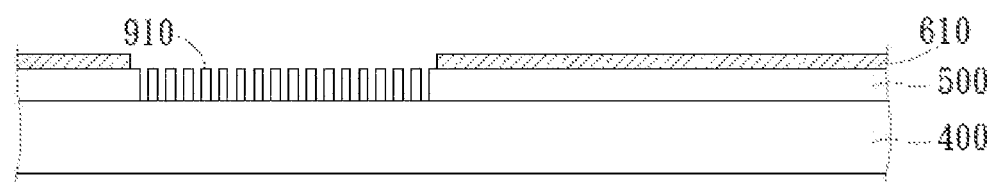

In an embodiment that a contact exposure is used, the first imprint area 701 of the first imprint photo-resist layer 710 shown in FIG. 7D forms a residual photo-resist layer 712 and the first imprint pattern 711 on the residual photo-resist layer 712 after applying imprinting. The first hard mask layer 610 has a hard mask layer thickness $H_{HM}$. The residual photo-resist layer has a residual photo-resist layer thickness $H_{RL}$. $H_{HM}$ is smaller than $H_{RL}$.

Figure 8A:
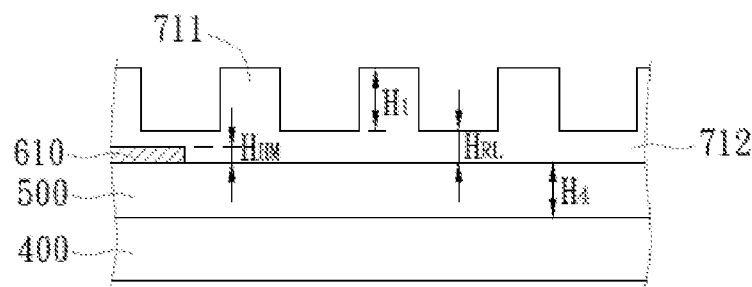
FIGS. 8A to 8C illustrate an embodiment of forming a first mold pattern on the first layer by performing an etching to the first imprint photo-resist layer and the first layer.
Figure 8B:
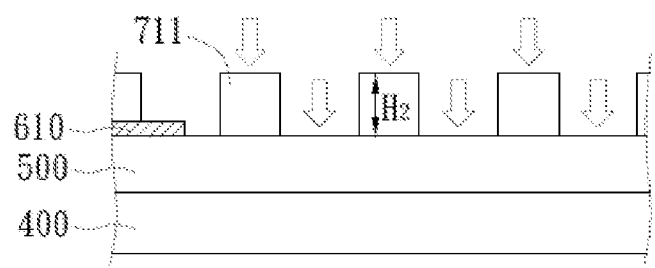

In a different embodiment, the first imprint area 701 of the first imprint photo-resist layer 710 shown in FIG. 7D forms a residual photo-resist layer 712 and the first imprint pattern 711 on the residual photo-resist layer 712 shown in FIG. 8A after applying imprinting. The residual photo-resist layer 712 has a residual photo-resist layer thickness $H_{RL}$. The first imprint pattern 711 has a first height $H_1$. As shown in FIG. 8B, when performing the etching to the first imprint photo-resist layer 710 and the first layer 500 until the residual photo-resist layer 712 (see FIG. 8A) has been cleared, the first imprint pattern 711 has a second height $H_2$, the top etching rate of the first imprint photo-resist layer is $E_1$, the bottom etching rate of the first imprint photo-resist layer is $E_2$, wherein $H_{RL} \leq [(H_1-(H_2-H_3)) \times (E_2/E_1)]$.

In a different embodiment, the first imprint area 701 of the first imprint photo-resist layer 710 shown in FIG. 7D forms a residual photo-resist layer 712 and the first imprint pattern 711 on the residual photo-resist layer 712 shown in FIG. 8A after applying imprinting. The first imprint pattern 711 has a first height $H_1$, wherein $H_1 \leq (3 \times \min$ (the line width of the first imprint pattern 711 or the spacing of the first imprint pattern 711)), i.e. $H_1$ is not larger than triple of the smaller one of the line width and the spacing of the first imprint pattern. In other words, the upper limit of the height of the first imprint pattern 711 is within the aspect ratio of 1:3.

Figure 8C:
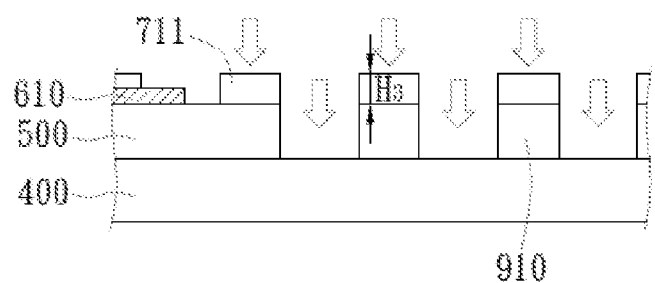

In a different embodiment, the first imprint area 701 of the first imprint photo-resist layer 710 shown in FIG. 7D forms a residual photo-resist layer 712 and the first imprint pattern 711 on the residual photo-resist layer 712 shown in FIG. 8A after applying imprinting. The first layer 500 has a fourth height $H_4$. As shown in FIG. 8B, when performing the etching to the first imprint photo-resist layer 710 and the first layer 500 until the residual photo-resist layer 712 (see FIG. 8A) has been cleared, the first imprint pattern 711 has a second height $H_2$, the top etching rate of the first imprint photo-resist layer 710 is $E_1$, the bottom etching rate of the first imprint photo-resist layer is $E_2$. As shown in FIG. 8C, when performing the etching to the first imprint photo-resist layer 710 and the first layer 500 until a portion of the substrate 400 has been exposed, the first imprint pattern 711 has a third height $H_3$, the etching rate of the first layer 500 is $E_3$, wherein $(H_2-H_3)=(E_1 \times (H_4/E_3))$.

Figure 7F:
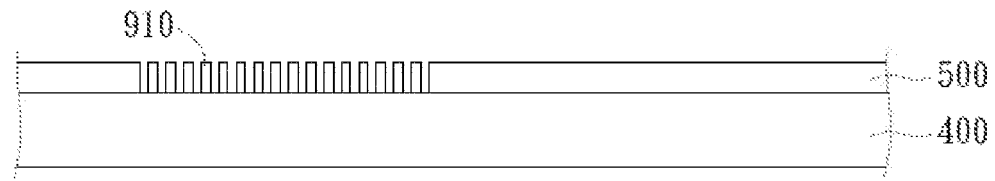

Step S4000 is a step that removes the first hard mask layer. One example is to immerse the substrate in etchant (such as acid solution) or to use dry-etching to remove the first hard mask layer 610 shown in FIG. 7E and to form the substrate 400 with the first layer 500 having the first mold pattern 910 on it as shown in FIG. 7F.

Figure 7G:
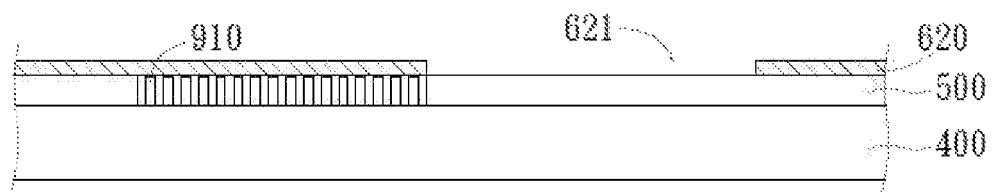

Step S5000 is a step that disposes a second hard mask layer on the first layer, wherein the second hard mask layer includes one or more second hollow area, wherein the region of the vertical projection of the second hollow area on the first layer is adjacent to the first mold pattern. As shown in the embodiment in FIG. 7G, a second hard mask layer 620 is disposed on the first layer 500, wherein the second hard mask layer 620 includes one or more second hollow area 621. A mask aligning technique is used to make the region of the vertical projection of the second hollow area 621 on the first layer 500 adjacent to the first mold pattern 910. For example, the second hard mask layer 620 overlaps the first mold pattern 910, wherein the second hollow area 621 reveals the first layer 500 adjacent to the first mold pattern 910. The second hard mask layer 620 could be single layer or multiple layers, which could be metal mask or alloy mask. The second hard mask layer 620 could be disposed by electroplating, electroless-plating, physical vapor deposition, and/or chemical vapor deposition.

Figure 7H:
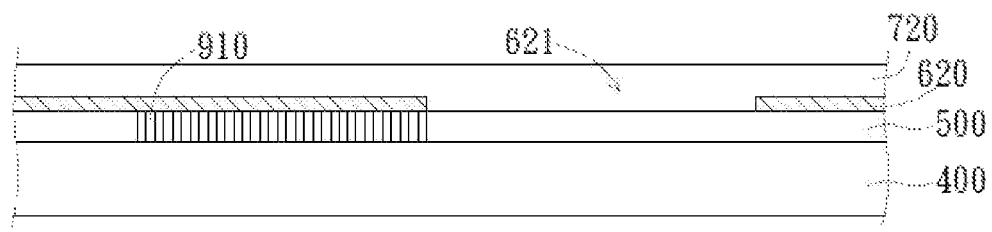
Figure 7I:
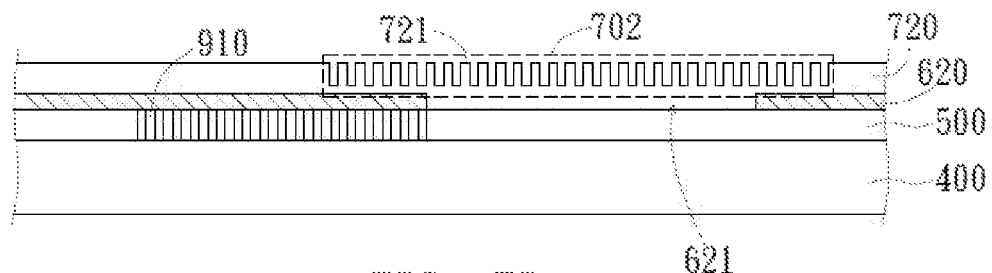
Figure 7J:
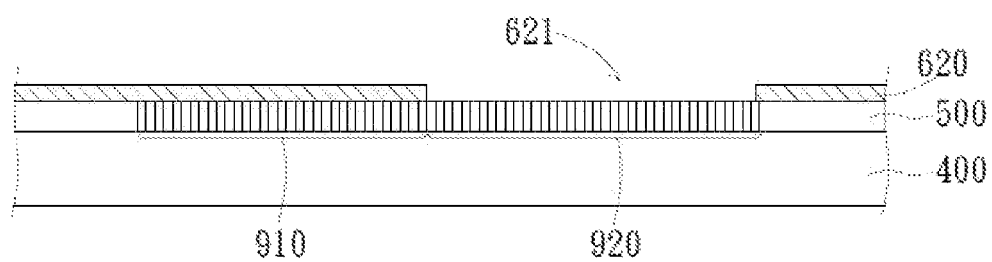

Step S6000 is a step that forms a second mold pattern on the first layer, wherein the region of the second mold pattern completely overlaps the region of the vertical projection of the second hollow area on the first layer. For example, in one embodiment, step S6000 includes disposing a second imprint photo-resist layer 720 on the second hard mask layer 620 and the second hollow area 621 as shown in FIG. 7H. Then, an imprinting on a second imprint area 702 of the second imprint photo-resist layer 720 is applied to form a second imprint pattern 721, wherein the region of the vertical projection of the second imprint area 702 on the second hard mask layer 620 contains the region of the second hollow area 621 completely. Afterward, an etching to the second imprint photo-resist layer 720 and the first layer 500 is performed to form the second mold pattern 920 on the first layer 500 as shown in FIG. 7J. To be certain of the area of the second mold pattern 920 after etching, preferably, the region of the formed second imprint pattern 721 includes a portion of the second imprint photo-resist layer 720 on the second hard mask layer 620 adjacent to the second hollow area 621. In one embodiment, nano-imprint lithography is used in the step that applies an imprinting on the second imprint area 702 of the second imprint photo-resist layer 720 to form the second imprint pattern 721. The detailed steps of performing an etching to the second imprint photo-resist layer 720 and the first layer 500 to form the second mold pattern 920 on the first layer 500 are similar to the steps shown in FIGS. 8A to 8C. More particularly, the second imprint photo-resist layer 720 having the second imprint pattern 721 is used as a mask while performing the etching. Since the second imprint pattern 721 is formed by nano-imprint lithography, the second mold pattern 920 as an end result of etching is in nano-scale.

Figure 7K:
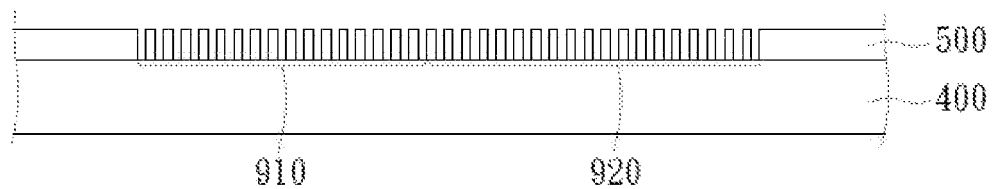

Step S7000 is a step that removes the second hard mask layer. More particularly, it uses immersion in etchant (such as acid solution) or dry-etching to remove the second hard mask layer 620 shown in FIG. 7J and to form the substrate 400 with the first layer 500 having the second mold pattern 920 on it shown in FIG. 7K.

In the embodiments shown in FIGS. 7A to 7K, identical mother mold is used in steps S3000 and S6000 to apply an imprinting on the first imprint area 701 (FIG. 7D) and the second imprint area 702 (FIG. 7I) respectively to form the first mold pattern 910 and the second mold pattern 920 having about the same patterns. Since the well-developed photo mask aligning technique (Photolithography) is used to make the region of the vertical projection of the second hollow area on the first layer adjacent to the first mold pattern when the second hard mask layer is disposed, the second mold pattern 920 subsequently formed will certainly be adjacent to the first mold pattern 910. Thus, mother mold having a smaller size can be directly used to form mold pattern having larger size. The cost and procedure for manufacturing mother mold having larger size can be reduced and therefore production cost could be lowered. In different embodiments, however, different mother molds are used for applying an imprinting on the first imprint area 701 (FIG. 7D) and the second imprint area 702 (FIG. 7I) respectively to form the first mold pattern 910 and the second mold pattern 920 having different patterns while still being adjacent to each other to increase the variety of mold patterns.

A variety of patterning methods can be used in steps S3000 and S6000.

Figure 9:
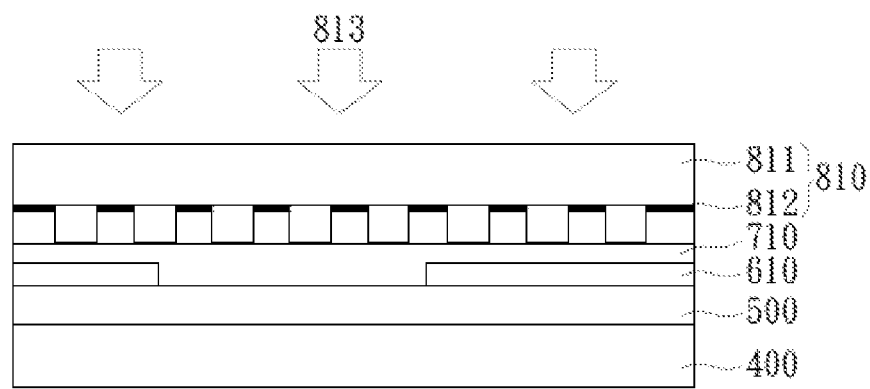
FIG. 9 illustrates an embodiment of performing a contact-exposing with a Polydimethylsiloxane (PDMS) mask.

In one embodiment, step S3000 includes: disposing a first pattern photo-resist layer 710 on the first hard mask layer 610 as shown in FIG. 7C; contact-exposing a first imprint area 701 of the first pattern photo-resist layer 710 shown in FIG. 7D with a polydimethylsiloxane (PDMS) mask to form a first exposure pattern, wherein the region of the vertical projection of the first imprint area 701 on the first hard mask layer 610 contains the region of the first hollow area 611 completely; performing an etching to the first imprint photo-resist layer 710 and the first layer 500 as shown in FIGS. 8A to 8C to form the first mold pattern 910 on the first layer 500 shown in FIG. 7E. The way of contact-exposing with a polydimethylsiloxane (PDMS) mask is shown in FIG. 9. The PDMS mask 810 includes a PDMS body 811 and a patterned metal layer 812. Ultra violet rays 813 passes through the PDMS mask 810 and irradiates the first imprint photo-resist layer 710 to perform exposing.

Figure 10:
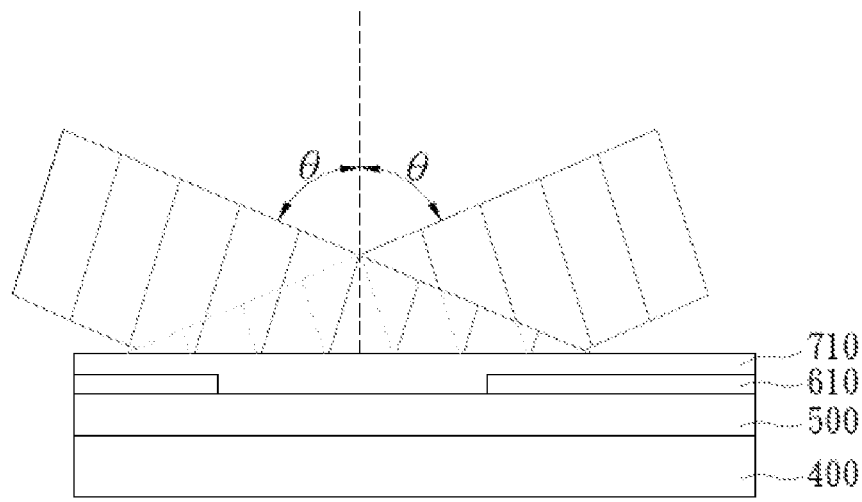
FIG. 10 illustrates an embodiment of performing an exposing with a UV interference mask.

In one embodiment, step S3000 includes: disposing a first pattern photo-resist layer 710 on the first hard mask layer 610 as shown in FIG. 7C; exposing a first imprint area 701 of the first pattern photo-resist layer 710 shown in FIG. 7D with a UV interference mask to form a first exposure pattern, wherein the region of the vertical projection of the first imprint area 701 on the first hard mask layer 610 contains the region of the first hollow area 611 completely; performing an etching to the first imprint photo-resist layer 710 and the first layer 500 as shown in FIGS. 8A to 8C to form the first mold pattern 910 on the first layer 500 shown in FIG. 7E. The way of exposing with a UV interference mask is shown in FIG. 10.

Figure 11:
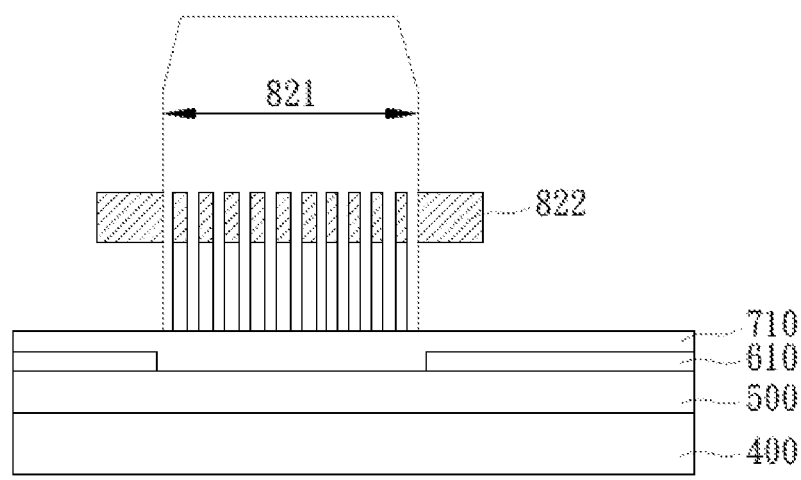
FIG. 11 illustrates an embodiment of performing an exposing by an electron beam scanning.

In one embodiment, step S3000 includes: disposing a first pattern photo-resist layer 710 on the first hard mask layer 610 as shown in FIG. 7C; exposing a first imprint area 701 of the first pattern photo-resist layer 710 by an electron beam scanning through a mask to form a first exposure pattern, wherein the region of the vertical projection of the first imprint area 701 on the first hard mask layer 610 contains the region of the first hollow area 611 completely; performing an etching to the first imprint photo-resist layer 710 and the first layer 500 as shown in FIGS. 8A to 8C to form the first mold pattern 910 on the first layer 500 shown in FIG. 7E. The way of exposing by an electron beam scanning through a mask is shown in FIG. 11. High resolution electron beam 821 passes through the Stencil Mask 822 and irradiates the first imprint photo-resist layer 710 to perform exposing.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An imprint mold manufacturing method, comprising:
(Step S1000) disposing a first layer on a substrate;
(Step S2000) disposing a first hard mask layer on the first layer, wherein the first hard mask layer includes one or more first hollow area via photolithography;
(Step S3000) forming a first mold pattern on the first layer by imprinting, wherein the region of the first mold pattern completely overlaps the region of the vertical projection of the first hollow area on the first layer;
(Step S4000) removing the first hard mask layer;
(Step S5000) disposing a second hard mask layer on the first layer, wherein the second hard mask layer includes one or more second hollow area via photolithography, wherein the region of the vertical projection of the second hollow area on the first layer is adjacent to the first mold pattern;
(Step S6000) forming a second mold pattern on the first layer by imprinting, wherein the region of the second mold pattern completely overlaps the region of the vertical projection of the second hollow area on the first layer; and
(Step S7000) removing the second hard mask layer.

2. The imprint mold manufacturing method of claim 1, wherein step S3000 includes:
disposing a first imprint photo-resist layer on the first hard mask layer and the first hollow area, wherein the first imprint photo-resist layer is flat and continuous;
applying an imprinting on a first imprint area of the first imprint photo-resist layer to form a first imprint pattern, wherein the region of the vertical projection of the first imprint area on the first hard mask layer contains the region of the first hollow area completely;
performing an etching to the first imprint photo-resist layer and the first layer to form the first mold pattern on the first layer.

3. The imprint mold manufacturing method of claim 2, wherein step S6000 includes:
disposing a second imprint photo-resist layer on the second hard mask layer and the second hollow area, wherein the second imprint photo-resist layer is flat and continuous;
applying an imprint on a second imprint area of the second imprint photo-resist layer to form a second imprint pattern, wherein the region of the vertical projection of the second imprint area on the second hard mask layer contains the region of the second hollow area completely;
performing an etching to the second imprint photo-resist layer and the first layer to form the second mold pattern on the first layer.

4. The imprint mold manufacturing method of claim 3, wherein same master mold is used to apply an imprint on the first imprint area and the second imprint area respectively in step S3000 and step S6000.

5. The imprint mold manufacturing method of claim 2, wherein a contact exposure is used, wherein the first imprint area of the first imprint photo-resist layer forms a residual photo-resist layer and a first imprint pattern on the residual photo-resist layer after imprinting is applied, wherein:
the first hard mask layer has a hard mask layer thickness ($H_{HM}$);
the residual photo-resist layer has a residual photo-resist layer thickness ($H_{RL}$);
$H_{HM} < H_{RL}$.

6. The imprint mold manufacturing method of claim 2, wherein the first imprint area of the first imprint photo-resist layer forms a residual photo-resist layer and a first imprint pattern on the residual photo-resist layer after imprinting is applied, wherein:
the residual photo-resist layer has a residual photo-resist layer thickness ($H_{RL}$);
the first imprint pattern has a first height ($H_1$);
when performing the etching to the first imprint photo-resist layer and the first layer until the residual photo-resist layer has been cleared:
the first imprint pattern has a second height ($H_2$);
the top etching rate of the first imprint photo-resist layer is $E_1$;
the bottom etching rate of the first imprint photo-resist layer is $E_2$;
when performing the etching to the first imprint photo-resist layer and the first layer until a portion of the substrate has been exposed, the first imprint pattern has a third height ($H_3$);
wherein $H_{RL} \leq [(H_1-(H_2-H_3)) \times (E_2/E_1)]$.

7. The imprint mold manufacturing method of claim 2, wherein the first imprint area of the first imprint photo-resist layer forms a residual photo-resist layer and a first imprint pattern on the residual photo-resist layer after imprinting is applied, wherein the first imprint pattern has a first height ($H_1$), wherein $H_1$ is not larger than triple of the smaller one of the line width and the spacing of the first imprint pattern.

8. The imprint mold manufacturing method of claim 2, wherein the first imprint area of the first imprint photo-resist layer forms a residual photo-resist layer and a first imprint pattern on the residual photo-resist layer after imprinting is applied, wherein:
the first layer has a fourth height ($H_4$);
when performing the etching to the first imprint photo-resist layer and the first layer until the residual photo-resist layer has been cleared, wherein
the first imprint pattern has a second height ($H_2$);
the top etching rate of the first imprint photo-resist layer is $E_1$;
when performing the etching to the first imprint photo-resist layer and the first layer until a portion of the substrate has been exposed, wherein
the first imprint pattern has a third height ($H_3$);
the etching rate of the first layer is $E_3$;
wherein $(H_2-H_3)=(E_1 \times (H_4/E_3))$.

9. The imprint mold manufacturing method of claim 1, wherein step S3000 includes:
disposing a first pattern photo-resist layer on the first hard mask layer;
contact-exposing a first imprint area of the first pattern photo-resist layer with a polydimethylsiloxane (PDMS) mask to form a first exposure pattern, wherein the region of the vertical projection of the first imprint area on the first hard mask layer contains the region of the first hollow area completely;
performing an etching to the first imprint photo-resist layer and the first layer to form the first mold pattern on the first layer.

10. The imprint mold manufacturing method of claim 1, wherein step S3000 includes:
- disposing a first pattern photo-resist layer on the first hard mask layer;
- exposing a first imprint area of the first pattern photo-resist layer with a UV interference mask to form a first exposure pattern, wherein the region of the vertical projection of the first imprint area on the first hard mask layer contains the region of the first hollow area completely;
- performing an etching to the first imprint photo-resist layer and the first layer to form the first mold pattern on the first layer.

11. The imprint mold manufacturing method of claim 1, wherein step S3000 includes:
- disposing a first pattern photo-resist layer on the first hard mask layer;
- exposing a first imprint area of the first pattern photo-resist layer by an electron beam scanning through a mask to form a first exposure pattern, wherein the region of the vertical projection of the first imprint area on the first hard mask layer contains the region of the first hollow area completely;
- performing an etching to the first imprint photo-resist layer and the first layer to form the first mold pattern on the first layer.

* * * * *